(12) United States Patent
Fishleigh (10) Patent No.: US 9,171,596 B2
(45) Date of Patent: Oct. 27, 2015

(54) SHORT ASYNCHRONOUS GLITCH (71) Applicant: STMicroelectronics (Research & Development) Limited, Marlow, Buckinghamshire (GB)

(72) Inventor: Andrew James Fishleigh, Bristol (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 77 days.

(21) Appl. No.: 14/074,243

(22) Filed: Nov. 7, 2013

(65) Prior Publication Data

US 2014/0140159 A1    May 22, 2014

(30) Foreign Application Priority Data

Nov. 22, 2012  (GB) .................................. 1221004.3

(51) Int. Cl.
| | |
|---|---|
| *H03K 3/01* | (2006.01) |
| *G11C 7/22* | (2006.01) |
| *H03K 3/037* | (2006.01) |

(52) U.S. Cl.
CPC ........ *G11C 7/22* (2013.01); *G11C 7/222* (2013.01); *H03K 3/0375* (2013.01)

(58) Field of Classification Search
CPC ............... G06F 1/24; G06F 1/26; G06F 1/30; G06F 1/305; H03K 3/011; H03K 3/0375
See application file for complete search history.

(56) References Cited

U.S. PATENT DOCUMENTS

| | | | | |
|---|---|---|---|---|
| 5,019,996 | A * | 5/1991 | Lee | 702/60 |
| 5,717,907 | A * | 2/1998 | Kuddes et al. | 713/500 |
| 6,393,558 | B1 * | 5/2002 | Kim | 713/1 |
| 6,563,349 | B2 * | 5/2003 | Menezes et al. | 327/99 |
| 7,550,694 | B2 | 6/2009 | Jyumonji et al. | |
| 7,663,517 | B1 * | 2/2010 | Rao et al. | 341/126 |
| 2003/0149912 | A1 * | 8/2003 | Lin | 714/23 |
| 2006/0164143 | A1 * | 7/2006 | Hendrickson | 327/199 |
| 2007/0010967 | A1 * | 1/2007 | Scherr | 702/182 |
| 2007/0058452 | A1 * | 3/2007 | Kim et al. | 365/189.05 |
| 2008/0126783 | A1 * | 5/2008 | Su et al. | 713/2 |
| 2013/0162036 | A1 * | 6/2013 | Mangattur et al. | 307/18 |
| 2013/0162044 | A1 * | 6/2013 | Mangattur et al. | 307/64 |

OTHER PUBLICATIONS

UK-IPO Search Report for GB1221004.3 mailed Apr. 25, 2013 (4 pgs).

* cited by examiner

*Primary Examiner* — Aristocratis Fotakis
(74) *Attorney, Agent, or Firm* — Gardere Wynne Sewell LLP (57) ABSTRACT

A circuit receives a parameter signal at a set or reset input, a clock signal at a clock input and a constant digital value at a data input. A synchronous signal is output from the circuit: wherein when the parameter signal is in a first state, then the output synchronous signal has the digital value; wherein when the parameter signal transitions to a second state, then the output synchronous signal transitions to an inverse of the digital value at substantially the same time; and wherein when the parameter signal transitions back to the first state, then the output synchronous signal transitions to the digital value on a next clock edge.

19 Claims, 6 Drawing Sheets

Figure 6

SHORT ASYNCHRONOUS GLITCH

PRIORITY CLAIM

This application claims priority from Great Britain Application for Patent No. 1221004.3 filed Nov. 22, 2012, the disclosure of which is incorporated by reference.

TECHNICAL FIELD

The present invention relates to the synchronous detection of a signal.

BACKGROUND

Some circuits may be connected to signal sources which may produce signals which have an unreliable magnitude. For example, some signals may fall below a minimum level required to ensure that the circuitry is able to function as expected. Alternatively or additionally, some signals may rise above a maximum allowable level and may result in the circuitry being damaged or destroyed.

Some synchronous circuit designs may require an analog voltage detection signal or Power OK (PWOK) signal to indicate whether a signal is above or below a threshold which is required by the circuitry. The changes to the magnitude of the signal from the signal source may occur asynchronously.

SUMMARY

There is provided according to a first aspect an apparatus circuit configured to: receive a parameter signal from a first circuit at a set or reset input, a clock signal at a clock input and a constant digital value at a data input; and output a synchronous signal to a second synchronous circuit wherein when said parameter signal is in a first state, said output synchronous signal is said digital value; when said parameter signal transitions to a second state, said output synchronous signal transitions to an inverse of said digital value at substantially the same time, and when said parameter signal transitions back to said first state, said output synchronous signal transitions to said digital value on a next clock edge.

The apparatus may comprise a first flip-flop. The apparatus may comprise a test circuit configured to receive said parameter signal at a first input, a reset signal at a second input and a test signal at a third input, wherein when said test signal is in a test state, said test circuit outputs said reset signal to the set or reset input of said first flip-flop and when said test signal is not in said test state, said test circuit outputs said parameter signal to the set or reset input of said first flip-flop.

The apparatus may further comprise at least one second flip-flop between said first flip-flop and said output to said second circuit, said at least one second flip-flop configured to: receive said parameter signal from said first circuit at one of a set or a reset input, a clock signal at a clock input and said synchronous signal from a preceding flip-flop at a data input; and output said synchronous signal wherein when said parameter signal transitions to said second state, said output synchronous signal transitions to an inverse of said digital value at substantially the same time and when said parameter signal transitions back to said first state, said at least one further flip-flop outputs said synchronous signal on a next clock edge.

The apparatus may further comprise a test circuit configured to receive said parameter signal at a first input, a reset signal at a second input and a test signal at a third input, wherein when said test signal is in a test state, said test circuit outputs said reset signal to the set or reset input of said first flip-flop and at least one second flip-flop and when said test signal is not in said test state, said test circuit outputs said parameter signal to the set or reset input of said first flip-flop and at least one second flip-flop.

The apparatus may further comprise at least one third flip-flop between said first flip-flop and said output to said second circuit, said at least one third flip-flop configured to: receive said synchronous signal at a data input and a clock signal at a clock input; and output said synchronous signal on a next clock edge.

The apparatus may further comprise providing said test signal to a set or reset input of said at least one third flip-flop. The test circuit may be a multiplexer. The parameter signal may comprise information about at least one voltage, current or power provided to said first circuit. The parameter signal may be asynchronous with respect to said clock signal.

A period of said clock signal may be slower than the period of at least one transition of said parameter signal. The synchronous signal may be synchronous with respect to said clock signal. The first circuit may comprise memory. The apparatus may be a monitoring circuit.

An arrangement may comprise the apparatus. The arrangement may comprise said second circuit. The second circuit may be configured to read from or write to a memory. An arrangement may comprise a first circuit configured to provide a parameter signal, wherein said parameter signal comprises two states; the apparatus; and a second synchronous circuit configured to be synchronized by a second clock and to receive said synchronous signal. An integrated circuit may comprise the arrangement.

There is provided according to a second aspect an apparatus comprising: a first circuit configured to provide a parameter signal; and a first flip-flop configured to: receive said parameter signal from said first circuit at one of a set or a reset input, a clock signal at a clock input and a constant digital value at a data input; and output a synchronous signal wherein when said parameter signal is in a first state said output synchronous signal is said digital value, when said parameter signal transitions to a second state, said output synchronous signal transitions to an inverse of said digital value at substantially the same time, and when said parameter signal transitions back to said first state, said output synchronous signal transitions to said digital value on a next clock edge, wherein said synchronous signal is configured to be output to a second circuit.

The apparatus may comprise a test circuit configured to receive said parameter signal at a first input, a reset signal at a second input and a test signal at a third input, wherein when said test signal is in a test state, said test circuit outputs said reset signal to the set or reset input of said first flip-flop and when said test signal is not in said test state, said test circuit outputs said parameter signal to the set or reset input of said first flip-flop.

The apparatus may further comprise at least one second flip-flop between said first flip-flop and said output to said second circuit, said at least one second flip-flop configured to: receive said parameter signal from said first circuit at one of a set or a reset input, a clock signal at a clock input and said synchronous signal from a preceding flip-flop at a data input; and output said synchronous signal wherein when said parameter signal transitions to said second state, said output synchronous signal transitions to an inverse of said digital value at substantially the same time and when said parameter signal transitions back to said first state, said at least one further flip-flop outputs said synchronous signal on a next clock edge.

The apparatus may further comprise a test circuit configured to receive said parameter signal at a first input, a reset signal at a second input and a test signal at a third input, wherein when said test signal is in a test state, said test circuit outputs said reset signal to the set or reset input of said first flip-flop and at least one second flip-flop and when said test signal is not in said test state, said test circuit outputs said parameter signal to the set or reset input of said first flip-flop and at least one second flip-flop.

The apparatus may further comprise at least one third flip-flop between said first flip-flop and said output to said second circuit, said at least one third flip-flop configured to: receive said synchronous signal at a data input and a clock signal at a clock input; and output said synchronous signal on a next clock edge.

The apparatus may further comprise providing said test signal to a set or reset input of said at least one third flip-flop. The test circuit may be a multiplexer. The parameter signal may comprise information about at least one voltage, current or power provided to said first circuit. The parameter signal may be asynchronous with respect to said clock signal.

A period of said clock signal may be slower than the period of at least one transition of said parameter signal. The synchronous signal may be synchronous with respect to said clock signal. The first circuit may comprise memory. The apparatus may be a monitoring circuit.

An arrangement may comprise the apparatus. The arrangement may comprise said second circuit. The second circuit may be configured to read from or write to a memory. An arrangement may comprise a first circuit configured to provide a parameter signal, wherein said parameter signal comprises two states; the apparatus; and a second synchronous circuit configured to be synchronized by a second clock and to receive said synchronous signal. An integrated circuit may comprise the arrangement.

There is provided according to a third aspect an apparatus comprising: a set or reset input configured to receive a parameter signal from a first circuit; a clock input configured to receive a clock signal; a data input configured to receive a constant digital value; circuitry configured to generate a synchronous signal wherein when said parameter signal is in a first state, said synchronous signal is said digital value; when said parameter signal transitions to a second state, said synchronous signal transitions to an inverse of said digital value at substantially the same time, and when said parameter signal transitions back to said first state, said output synchronous signal transitions to said digital value on a next clock edge; and an output configured to output said synchronous signal.

The apparatus may comprise a first flip-flop. The apparatus may comprise a test circuit configured to receive said parameter signal at a first input, a reset signal at a second input and a test signal at a third input, wherein when said test signal is in a test state, said test circuit outputs said reset signal to the set or reset input of said first flip-flop and when said test signal is not in said test state, said test circuit outputs said parameter signal to the set or reset input of said first flip-flop. The apparatus may further comprise at least one second flip-flop between said first flip-flop and said output to said second circuit, said at least one second flip-flop configured to: receive said parameter signal from said first circuit at one of a set or a reset input, a clock signal at a clock input and said synchronous signal from a preceding flip-flop at a data input; and output said synchronous signal wherein when said parameter signal transitions to said second state, said output synchronous signal transitions to an inverse of said digital value at substantially the same time and when said parameter signal transitions back to said first state, said at least one further flip-flop outputs said synchronous signal on a next clock edge.

The apparatus may further comprise a test circuit configured to receive said parameter signal at a first input, a reset signal at a second input and a test signal at a third input, wherein when said test signal is in a test state, said test circuit outputs said reset signal to the set or reset input of said first flip-flop and at least one second flip-flop and when said test signal is not in said test state, said test circuit outputs said parameter signal to the set or reset input of said first flip-flop and at least one second flip-flop.

The apparatus may further comprise at least one third flip-flop between said first flip-flop and said output to said second circuit, said at least one third flip-flop configured to: receive said synchronous signal at a data input and a clock signal at a clock input; and output said synchronous signal on a next clock edge.

The apparatus may further comprise providing said test signal to a set or reset input of said at least one third flip-flop. The test circuit may be a multiplexer. The parameter signal may comprise information about at least one voltage, current or power provided to said first circuit. The parameter signal may be asynchronous with respect to said clock signal.

A period of said clock signal may be slower than the period of at least one transition of said parameter signal. The synchronous signal may be synchronous with respect to said clock signal. The first circuit may comprise memory. The apparatus may be a monitoring circuit.

An arrangement may comprise the apparatus. The arrangement may comprise said second circuit. The second circuit may be configured to read from or write to a memory. An arrangement may comprise a first circuit configured to provide a parameter signal, wherein said parameter signal comprises two states; the apparatus; and a second synchronous circuit configured to be synchronized by a second clock and to receive said synchronous signal. An integrated circuit may comprise the arrangement.

There is provided according to a fourth aspect a method comprising: receiving a parameter signal from a first circuit at a set or reset input, a clock signal at a clock input and a constant digital value at a data input; and outputting a synchronous signal to a second synchronous circuit wherein when said parameter signal is in a first state, said output synchronous signal is said digital value; when said parameter signal transitions to a second state, said output synchronous signal transitions to an inverse of said digital value at substantially the same time, and when said parameter signal transitions back to said first state, said output synchronous signal transitions to said digital value on a next clock edge.

The synchronous signal may be output by a first flip-flop. The method may further comprise receiving said parameter signal at a first input of a test circuit, a reset signal at a second input of said test circuit and a test signal at a third input of said test circuit; outputting said reset signal from said test circuit to the set or reset input of said first flip-flop when said test signal is in a test state; and outputting said parameter signal from said test circuit to the set or reset input of said first flip-flop when said test signal is not in said test state.

The method may further comprise receiving at least one second flip flop said parameter signal from said first circuit at one of a set or a reset input, a clock signal at a clock input and said synchronous signal from a preceding flip-flop at a data input; and outputting said synchronous signal from said at least one second flip flop to said second circuit wherein when said parameter signal transitions to said second state, said output synchronous signal transitions to an inverse of said digital value at substantially the same time and when said parameter signal transitions back to said first state, said synchronous signal is output on a next clock edge.

The method may further comprise: receiving said parameter signal at a first input of a test circuit, a reset signal at a second input of said test circuit and a test signal at a third input of said test circuit, outputting from said reset signal to the set or reset input of a first flip-flop and at least one second flip-flop when said test signal is in a test state; and outputting said parameter signal to the set or reset input of said first flip-flop and at least one second flip-flop when said test signal is not in said test state.

The method may further comprise: receiving at a data input of at least one third flip-flop said synchronous signal and a clock signal at a clock input; and outputting said synchronous signal on a next clock edge. The method may further comprising: providing said test signal to a set or reset input of said at least one third flip-flop. The test circuit may be a multiplexer.

The parameter signal may comprise information about at least one voltage, current or power provided to said first circuit. The parameter signal may be asynchronous with respect to said clock signal. A period of said clock signal may be slower than the period of at least one transition of said parameter signal.

The synchronous signal may be synchronous with respect to said clock signal. The first circuit may comprise a memory. The method may be used for monitoring. An arrangement may be configured to perform the method.

There is provided according to a fifth aspect a method comprising: receiving at a set or reset input a parameter signal from a first circuit; receiving at a clock input a clock signal; receiving at a data input a constant digital value; generating a synchronous signal wherein when said parameter signal is in a first state, said synchronous signal is said digital value; when said parameter signal transitions to a second state, said synchronous signal transitions to an inverse of said digital value at substantially the same time, and when said parameter signal transitions back to said first state, said output synchronous signal transitions to said digital value on a next clock edge; and outputting at an output said synchronous signal.

The synchronous signal may be output by a first flip-flop. The method may further comprise receiving said parameter signal at a first input of a test circuit, a reset signal at a second input of said test circuit and a test signal at a third input of said test circuit; outputting said reset signal from said test circuit to the set or reset input of said first flip-flop when said test signal is in a test state; and outputting said parameter signal from said test circuit to the set or reset input of said first flip-flop when said test signal is not in said test state.

The method may further comprise receiving at least one second flip flop said parameter signal from said first circuit at one of a set or a reset input, a clock signal at a clock input and said synchronous signal from a preceding flip-flop at a data input; and outputting said synchronous signal from said at least one second flip flop to said second circuit wherein when said parameter signal transitions to said second state, said output synchronous signal transitions to an inverse of said digital value at substantially the same time and when said parameter signal transitions back to said first state, said synchronous signal is output on a next clock edge.

The method may further comprise: receiving said parameter signal at a first input of a test circuit, a reset signal at a second input of said test circuit and a test signal at a third input of said test circuit, outputting from said reset signal to the set or reset input of a first flip-flop and at least one second flip-flop when said test signal is in a test state; and outputting said parameter signal to the set or reset input of said first flip-flop and at least one second flip-flop when said test signal is not in said test state.

The method may further comprise: receiving at a data input of at least one third flip-flop said synchronous signal and a clock signal at a clock input; and outputting said synchronous signal on a next clock edge. The method may further comprising: providing said test signal to a set or reset input of said at least one third flip-flop. The test circuit may be a multiplexer.

The parameter signal may comprise information about at least one voltage, current or power provided to said first circuit. The parameter signal may be asynchronous with respect to said clock signal. A period of said clock signal may be slower than the period of at least one transition of said parameter signal.

The synchronous signal may be synchronous with respect to said clock signal. The first circuit may comprise a memory. The method may be used for monitoring. An arrangement may be configured to perform the method.

There is provided according to a sixth aspect a method comprising: receiving a parameter signal from a first circuit at one of a set or a reset input of a first flip-flop, a clock signal at a clock input of said first flip-flop and a constant digital value at a data input of said first flip-flop; and outputting a synchronous signal wherein when said parameter signal is in a first state said output synchronous signal is said digital value, when said parameter signal transitions to a second state, said output synchronous signal transitions to an inverse of said digital value at substantially the same time, and when said parameter signal transitions back to said first state, said output synchronous signal transitions to said digital value on a next clock edge.

The synchronous signal may be output by a first flip-flop. The method may further comprise receiving said parameter signal at a first input of a test circuit, a reset signal at a second input of said test circuit and a test signal at a third input of said test circuit; outputting said reset signal from said test circuit to the set or reset input of said first flip-flop when said test signal is in a test state; and outputting said parameter signal from said test circuit to the set or reset input of said first flip-flop when said test signal is not in said test state.

The method may further comprise receiving at least one second flip flop said parameter signal from said first circuit at one of a set or a reset input, a clock signal at a clock input and said synchronous signal from a preceding flip-flop at a data input; and outputting said synchronous signal from said at least one second flip flop to said second circuit wherein when said parameter signal transitions to said second state, said output synchronous signal transitions to an inverse of said digital value at substantially the same time and when said parameter signal transitions back to said first state, said synchronous signal is output on a next clock edge.

The method may further comprise: receiving said parameter signal at a first input of a test circuit, a reset signal at a second input of said test circuit and a test signal at a third input of said test circuit, outputting from said reset signal to the set or reset input of a first flip-flop and at least one second flip-flop when said test signal is in a test state; and outputting said parameter signal to the set or reset input of said first flip-flop and at least one second flip-flop when said test signal is not in said test state.

The method may further comprise: receiving at a data input of at least one third flip-flop said synchronous signal and a clock signal at a clock input; and outputting said synchronous signal on a next clock edge. The method may further comprising: providing said test signal to a set or reset input of said at least one third flip-flop. The test circuit may be a multiplexer.

The parameter signal may comprise information about at least one voltage, current or power provided to said first circuit. The parameter signal may be asynchronous with respect to said clock signal. A period of said clock signal may be slower than the period of at least one transition of said parameter signal.

The synchronous signal may be synchronous with respect to said clock signal. The first circuit may comprise a memory. The method may be used for monitoring. An arrangement may be configured to perform the method.

There is provided according to a seventh aspect an apparatus comprising: means for receiving a parameter signal from a first circuit at a set or reset input, a clock signal at a clock input and a constant digital value at a data input; and means for outputting a synchronous signal to a second synchronous circuit wherein when said parameter signal is in a first state, said output synchronous signal is said digital value; when said parameter signal transitions to a second state, said output synchronous signal transitions to an inverse of said digital value at substantially the same time, and when said parameter signal transitions back to said first state, said output synchronous signal transitions to said digital value on a next clock edge.

The apparatus may further comprise means for receiving said parameter signal at a first input of a means for testing, a reset signal at a second input of said means for testing and a test signal at a third input of said means for testing; means for outputting said reset signal from said means for testing to the set or reset input of said first flip-flop when said test signal is in a test state; and means for outputting said parameter signal from said means for testing to the set or reset input of said first flip-flop when said test signal is not in said test state.

The apparatus may further comprise means for receiving at least one second flip flop said parameter signal from said first circuit at one of a set or a reset input, a clock signal at a clock input and said synchronous signal from a preceding flip-flop at a data input; and means for outputting said synchronous signal from said at least one second flip flop to said second circuit wherein when said parameter signal transitions to said second state, said output synchronous signal transitions to an inverse of said digital value at substantially the same time and when said parameter signal transitions back to said first state, said synchronous signal is output on a next clock edge.

The apparatus may further comprise: means for receiving said parameter signal at a first input of a means for testing, a reset signal at a second input of said means for testing and a test signal at a third input of said means for testing, means for outputting from said reset signal to the set or reset input of a first flip-flop and at least one second flip-flop when said test signal is in a test state; and means for outputting said parameter signal to the set or reset input of said first flip-flop and at least one second flip-flop when said test signal is not in said test state.

The apparatus may further comprise: means for receiving at a data input of at least one third flip-flop said synchronous signal and a clock signal at a clock input; and means for outputting said synchronous signal on a next clock edge. The apparatus may further comprising: means for providing said test signal to a set or reset input of said at least one third flip-flop. The means for testing may be a multiplexer.

The parameter signal may comprise information about at least one voltage, current or power provided to said first circuit. The parameter signal may be asynchronous with respect to said clock signal. A period of said clock signal may be slower than the period of at least one transition of said parameter signal.

The synchronous signal may be synchronous with respect to said clock signal. The first circuit may comprise means for storing data. The apparatus may for monitoring. An arrangement may comprise the apparatus.

BRIEF DESCRIPTION OF THE DRAWINGS

Embodiments of the invention will now be described, by way of example only, with reference to the Figures, in which.

DETAILED DESCRIPTION OF THE DRAWINGS

Figure 1:
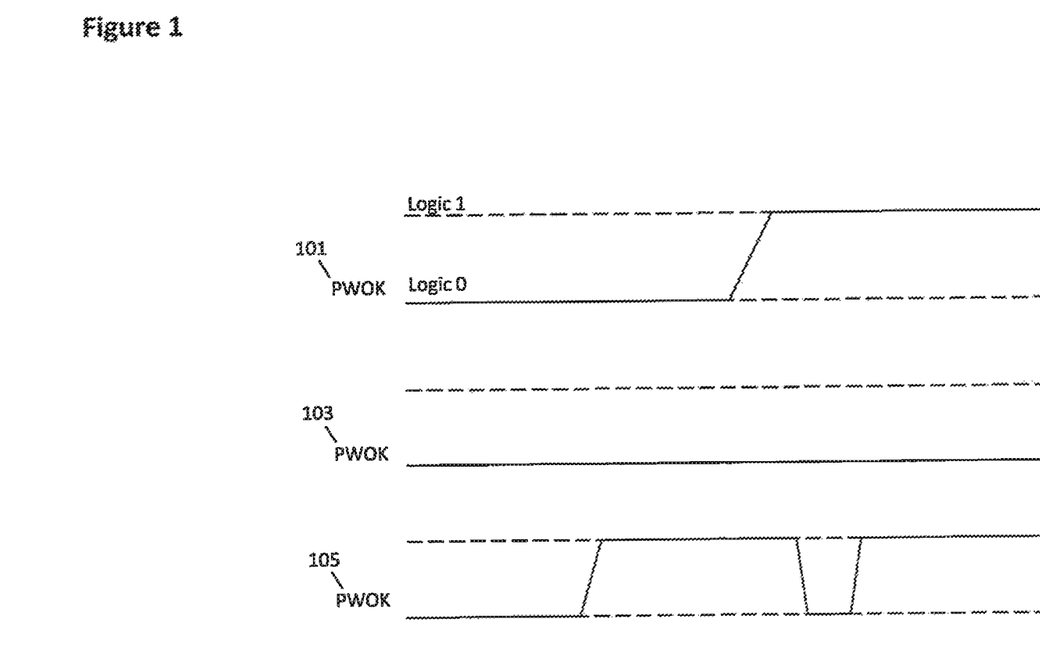
FIG. 1 shows some possible PWOK signal behaviors.

FIG. 1 shows three possible behaviors of the PWOK signal. These are by way of example only and other behaviors are alternatively or additionally possible. In some scenarios these signals may be required in order to determine whether the power supplied to a circuit is stable. However, the behavior of these signals may result in changes to the signal being difficult to detect. In a circuit, one or more different PWOK signal behaviors may occur. In the first behavior, the PWOK signal 101 remains at a logic 0 for a length of time and then transitions to a logic 1 later. In the second behavior, the PWOK signal 103 remains at logic 0 and never transitions to a logic 1.

In the third behavior, the PWOK signal 105 transitions from a logic 0 to a logic 1, and later for a short period of time re-transitions to a logic 0 before re-transitioning to a logic 1. The short transition of PWOK signal 105 may occur due to a glitch in the voltage supply being detected by the circuit that generates PWOK. The synchronous circuitry requires a synchronous voltage detection signal. However, as the PWOK signal is asynchronous, the length of the glitch may be considerably shorter than a clock period of the synchronous logic. As the clock period of the synchronous logic may be undetermined, capacitor-discharge circuits may not be suitable for lengthening the duration of the glitch because the discharge time of a capacitor is finite and dependent on silicon process, voltage and temperature (PVT) variations.

Thus when trying to detect a change in the PWOK signal using clocked logic there may be no guaranteed minimum low pulse width of the output from the voltage detection circuit.

Figures 2A, 2B:
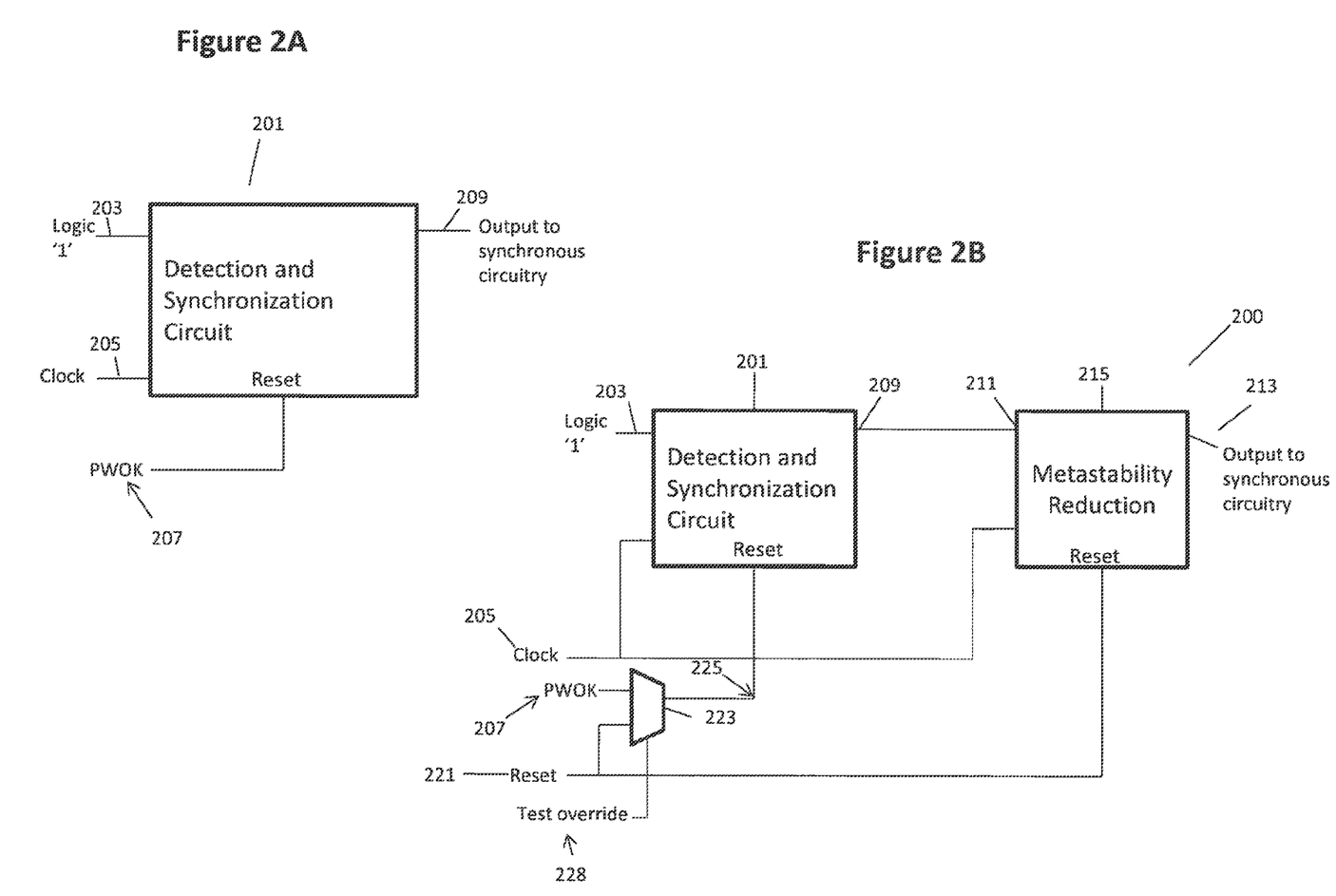
FIG. 2A shows a block diagram of a detection and synchronization circuit.
FIG. 2B shows a block diagram of a detection and synchronization circuit, a metastability reduction circuit and a design-for-test bypass mechanism.

FIG. 2A shows a detection and synchronization circuit 201. The detection and synchronization circuit 201 is configured to receive as a first input a logic 1 signal 203 and as a second input a clock signal 205. The clock signal 205 may also be provided to the synchronous circuitry. The detection and synchronization circuit 201 is further configured to receive as third input a PWOK signal 207. The detection and synchronization circuit 201 is configured to provide an output signal 209. The output signal 209 is de-asserted asynchronously to the clock signal 205 and is asserted synchronously with respect to the clock signal 205.

When the PWOK signal 207 transitions to a logic 1 value, the detection and synchronization circuit 201 is configured such that on a subsequent clock cycle the output to digital logic signal 209 is a rising edge from a logic 0 value to a logic 1 value. The transition from logic 0 to logic 1 within the detection and synchronization circuit occurs synchronously. The detection and synchronization circuit is configured to continue outputting a constant logic 1 value until the PWOK signal 207 transitions to a logic 0 value.

When the PWOK signal 207 transitions to a logic 0 value, the value on the output of the detection and synchronization circuit transitions to a logic 0 value asynchronously. When the PWOK signal 207 remains at a logic 0 value at a next clock edge, the output signal 209 at that next clock edge has a logic 0 value.

In some embodiments, the PWOK signal 207 may return to a logic 1 value before the next clock edge. In some such embodiments the output signal rises to a logic 1 value on the next clock edge and thus provides a synchronous indication that the PWOK signal 207 has glitched. In other such embodiments, a logic 0 is output on the next clock edge and then a logic 1 value is output on the subsequent clock edge thus providing a synchronous indication that the value of the PWOK signal 207 has fallen and then subsequently risen.

When the PWOK signal is a logic 0, the detection and synchronization circuit is held in a reset state and does not output a signal. When the PWOK signal 207 transitions in a manner of PWOK signal 101, the detection and synchronization circuit 201 is enabled and a logic 1 value is input into the detection and synchronization circuit 201 on receipt of the rising edge of the following clock signal 205. While the PWOK signal 207 remains at a logic 1 value, the logic 1 value 203 received at the first input of the detection and synchronization circuit 201 continues to be output 209 to the synchronous circuitry for each clock pulse.

When the PWOK signal 207 remains at logic 0 value such as for a PWOK signal 103, the detection and synchronization circuit 201 is held in the reset state. This means that the detection and synchronization circuit 201 does not clock the logic 1 value 203 and so the detection and synchronization circuit 201 outputs a logic 0 value as the output to synchronous circuitry signal 209.

When the PWOK signal 207 glitches from a logic 1 value to a logic 0 value and then returns to a logic 1 value such as for a PWOK signal 105, the detection and synchronization circuit 201 clocks the logic 1 value 203 for each clock cycle when the PWOK signal is high. However, whilst the PWOK signal is low, the synchronization circuit outputs a logic 0 value.

FIG. 2B shows a detection and synchronization circuit 201 where the output signal 209 is passed through a metastability reduction circuit 215 prior to being output 213 to synchronous circuitry. The detection and synchronization circuit 201 is configured to receive as a first input the logic 1 signal 203 and as a second input clock signal 205. The detection and synchronization circuit 201 is further configured to receive as a third input an output control signal 225 provided by an optional design for test bypass multiplexer 223. The detection and synchronization circuit 201 is configured to provide as an output the signal 209 which is received as first input 211 by the metastability reduction circuit 215.

The metastability reduction circuit 215 is further configured to receive as a second input the clock signal 205 and as a third input a reset signal 221. The metastability reduction circuit is configured to provide as an output a signal 213 to the synchronous circuitry.

The design-for-test multiplexer 223 is configured to receive as a first input a PWOK signal 207 and as a second input the reset signal 221 and to provide as an output the control signal 225 which is received as an input by the detection and synchronization circuit 201. The multiplexer 223 is further configured to receive a test override signal as a third input 228. The test override signal is used to control the multiplexer 223 and determine which of the PWOK signal 207 and the reset signal 221 is provided to the detection and synchronization circuit 201 as the control signal 225.

The detection and synchronization circuit 201 shown in FIG. 2B operates in substantially the same manner as the detection and synchronization circuit 201 described above in relation to FIG. 2A. The output 209 from the detection and synchronization circuit 201 is passed through a metastability reduction circuit 215.

The test override signal 228 is configured to control the multiplexer 223. When the circuitry 200 is operational, the test override signal 228 selects the PWOK signal 207 to be transmitted to the detection and synchronization circuit 201.

The test override may provide a completely controllable hard reset to the re-synchronization circuit. This may enable the flip-flops to be tested using a scan test.

Embodiments which do not require scan testing may not comprise the test override multiplexer.

Figure 3:
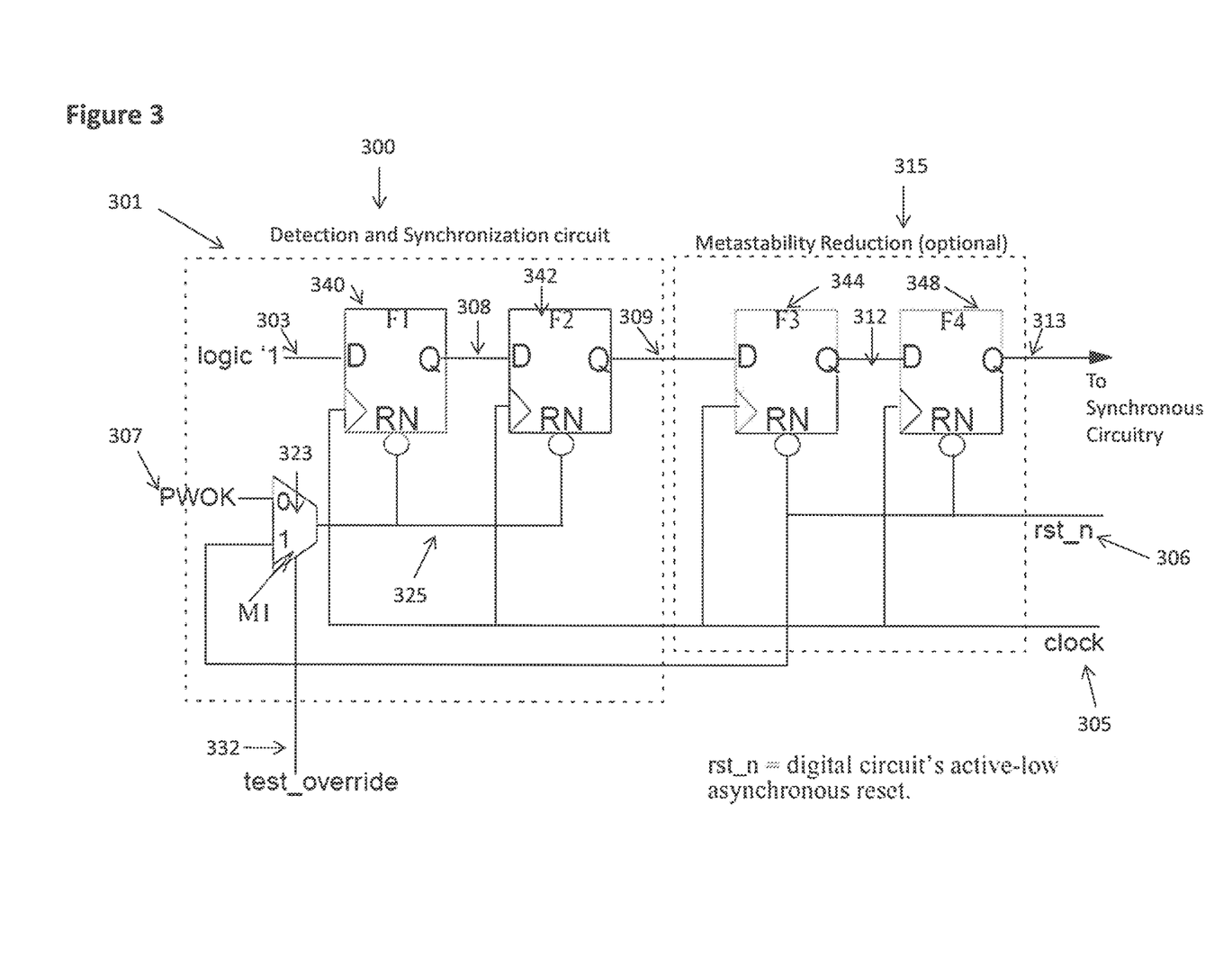
FIG. 3 shows a circuit implementation of a detection and synchronization circuit and a metastability reduction circuit, including test bypass mechanism.

FIG. 3 shows an implementation of FIG. 2B. Elements referenced as 2xx in FIG. 2B are referenced as 3xx in FIG. 3. The circuitry 300 of FIG. 3 comprises a detection and synchronization circuit 301 and a metastability reduction circuit 315.

The detection and synchronization circuit 301 comprises a first flip-flop 340, a second flip-flop 342 and a multiplexer 323. The first flip-flop 340 is configured to receive as an input a logic 1 value 303. The first flip-flop is further configured to receive a clock signal 305 at a clock input. The first flip-flop 340 is further configured to receive as a reset input an output 325 provided by the multiplexer 323. The first flip-flop 340 is configured to provide as an output a signal 308 which is received as an input by the second flip-flop 342. The second flip-flop 342 is further configured to receive as an input the clock signal 305 at its clock input and the output 325 from the multiplexer 323 at the reset input. The second flip-flop 342 is configured to provide as an output a signal 309 which is received as an input by the metastability reduction circuit 315.

The multiplexer 323 of the detection and synchronization circuit 301 is configured to receive a PWOK signal 307 as a first input and as a reset signal 306 as a second input. The multiplexer 323 is configured to be controlled by a test override signal 332, when the test override signal 332 is at a logic 0 value the PWOK signal 307 is output 325 from the multiplexer 323 and when the test override signal 332 is at a logic 1, the reset signal 306 is output 325 by the multiplexer 323.

The metastability reduction circuit 315 comprises a third flip-flop 344 and a fourth flip-flop 348. The third flip-flop 344 is configured to receive as an input the signal 309 which is provided as an output from the detection and synchronization circuit 301. The third flip-flop 344 is further configured to receive as an input the clock signal 305. The third flip-flop 344 is also configured to receive the reset signal 306. The third flip-flop 344 is configured to provide as an output a signal 312 which is received as input by the fourth flip-flop 348. The fourth flip-flop 348 is further configured to receive as an input the clock signal 305 and the reset signal 306. The fourth flip-flop 348 is configured to provide as an output the signal 313 which is provided to the synchronous circuitry. When the reset signal 306 is asserted, the third and fourth flip-flops 344 and 348 are reset asynchronously.

Figure 4:
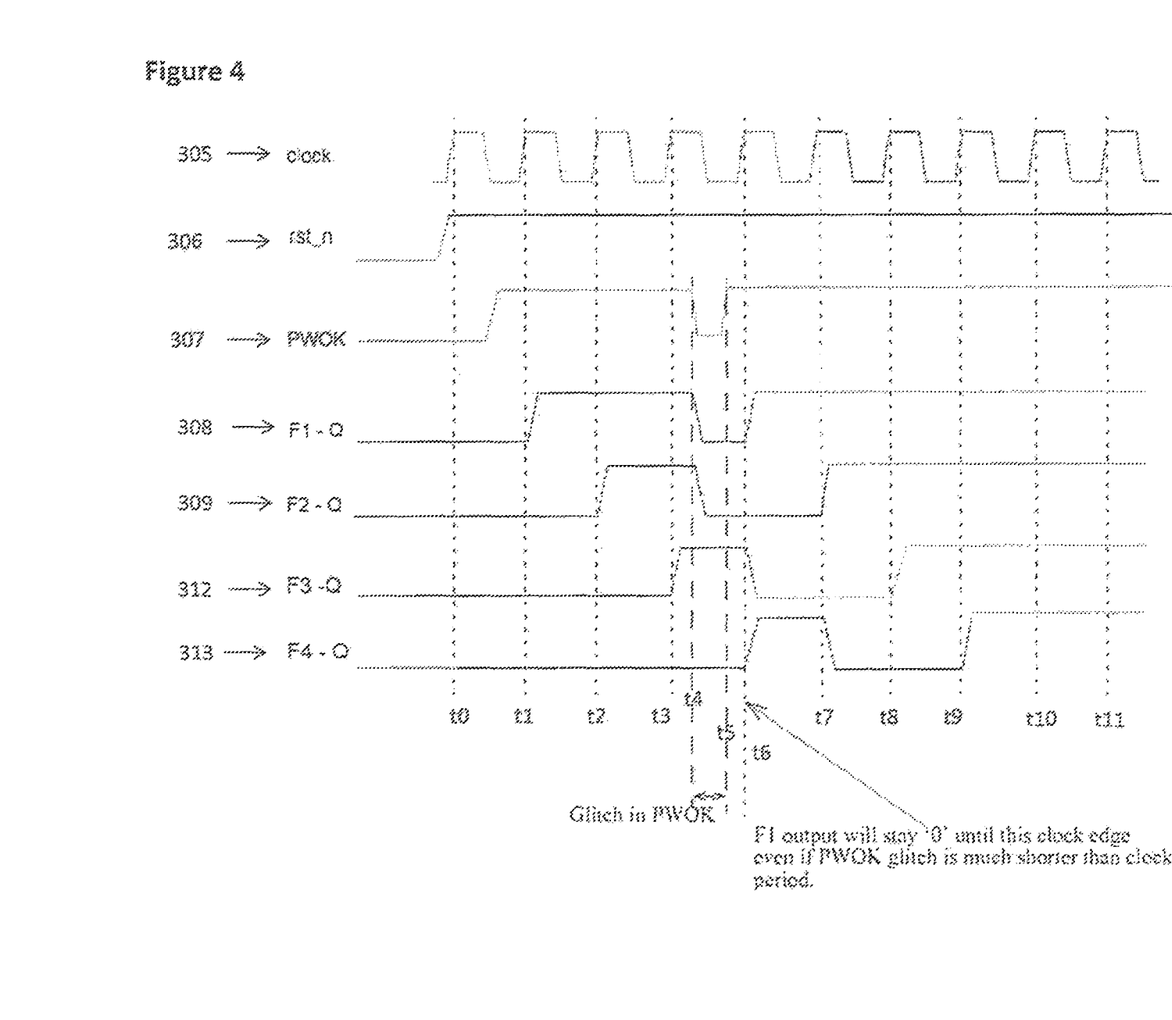
FIG. 4 shows a timing diagram of an embodiment of the detection and synchronization circuit and the metastability circuit of FIG. 3.

The function of FIG. 3 is described in more detail in relation to FIG. 4.

FIG. 4 shows a time diagram of the circuitry shown in FIG. 3. The rising transitions of the clock signal 305 finish at the relevant time markers. The rising and falling transitions of the PWOK signal 307 and the flip-flop outputs 308, 309, 312, 313 commence at the relevant time markers.

The clock signal 305 provides a rising edge such that the value of the clock at each time marker T0, T1, T2, T3, T6, T7, T8, T9, T10 and T11 is a logic 1. The period of the clock is the time interval between each of the time markers. Time markers T4 and T5 occur between the rising clock edges at T3 and T6. Thus the time intervals T3 to T4, T4 to T5 and T5 to T6 are smaller than the clock period which is the time interval T3 to T6.

The reset signal 306 transitions from a logic 0 value to a logic 1 value at T0 and remains at a logic 1 value until after T11. This value resets the four flip-flops 340, 342, 344 and 348.

The PWOK signal 307 transitions from a logic 0 to a logic 1 value between time period T0 and the time period T1. The PWOK signal 307 remains at a logic 1 value until T4 when it transitions to a logic 0 value until T5 when it re-transitions to a logic 1 value. The logic 1 value is retained by the PWOK signal 307 until after T11.

The output signal 308 provided by the first flip-flop 304 remains at a logic 0 value until T1 when it transitions to a logic 1 value. At T4, it transitions to a logic 0 value. At T6 it transitions to a logic 1 value. The output 308 remains at a logic 1 value until after T11.

The output 309 of the detection and synchronization circuit 301 provided by the second flip flop is a logic 0 value until T2 when it transitions to a logic 1 value. The signal 209 transitions to a logic 0 value at T4 and retains the logic 0 value until T7 when it transitions to a logic 1 value. The signal 309 retains the logic 1 value until after T11.

The output 312 of the third flip-flop 344 is a logic 0 value until T3 when it transitions to a logic 1 value. At T6, the value of signal 312 transitions to a logic 0 value until T8 when it re-transitions to a logic 1 value. The value of 312 remains at a logic 1 until after T11.

The output signal 313 of the metastability reduction circuit which is provided to the synchronous circuitry by the fourth flip flop remains at a logic 0 value until T6 when it transitions to a logic 1 value. At T7, it transitions to a logic 0 value until T9 when it re-transitions to a logic 1 value until after T11.

As can be seen in FIG. 4, once the circuit 300 has been reset 306 at T0 the transition of PWOK signal 307 resets the first flip-flop 340 and the second flip-flop 342.

The high PWOK signal 307 and the rising edge of the clock 305 at T1 results in a logic 1 value being stored in the flip-flop 340. As the input of the first flip-flop 340 is held at a logic 1 value, the value output by the first flip-flop 340 will remain at a logic 1 value until either the PWOK signal 307 changes or the test override signal is asserted. The logic 1 output by the first flip-flop 340 at T1 propagates synchronously through the second flip-flop, third flip-flop and fourth flip-flop at times T2, T3 and T6 respectively. This may result in an indication of the first transition of the PWOK signal 307 being synchronously output to the synchronous circuitry at T6.

When the PWOK signal falls to a logic 0 value at the glitch at T4, the first flip-flop 340 and the second flip-flop 342 are reset asynchronously. This results in the logic level of the outputs 308 and 309 of the first and second flip flops 340, 342 asynchronously dropping to a logic 0 at T4.

At the next clock cycle at time T6, the logic 0 value in the first flip-flop 340 created by the first flip-flop 340 being reset is passed to the second flip-flop 342 and the logic 0 value in the second flip-flop 342 created by the second flip-flop 342 being reset is passed to the third flip-flop 344.

At time T7, the logic 0 value in the second flip-flop 342, which originated in the first flip-flop 340, is passed to the third flip-flop 344 and the logic 0 value in the third flip-flop 344, which originated in the second flip-flop 342, is passed to the fourth flip-flop 348.

At time T8, the logic 0 value in the third flip-flop 348 is passed to the fourth flip-flop 348.

The fall in the output signal provided by the second flip-flop 342 and first flip-flop 340 due to the fall in the PWOK signal 307 may be seen as a logic 0 value on the output signal 313 provided by the fourth flip-flop 348 at times T8 and T9 respectively.

As the PWOK signal 307 returns to a logic 1 at T5, the first flip-flop 340 is able to clock a logic 1 value on the next clock cycle at T6. As the PWOK signal 307 does not change throughout the rest of the time period shown, the output 308 of the first flip-flop 340 does not change again and remains at a logic 1 until after T11.

The logic 1 value clocked by the first flip-flop 340 at T6 propagates through to the second flip-flop 342 at T7, the third flip-flop at T8 and the fourth flip-flop at T9.

The rise in the output signal 308 of the first flip-flop 340 due to the rise in the PWOK signal 306 may be seen as the rising edge on the output 313 provided by the fourth flip-flop at T9.

The rising edge generated by the PWOK signal 307 returning to a logic 1 value at T5 propagates through to the output 312 of the third flip-flop 344 at time T8 when the output of third flip-flop 344 transitions to a logic 1 value. This logic 1 value is retained until after T11.

The output value 313 of the fourth flip-flop 348 re-transitions to a logic 1 value at T9 in response to the transition of output signal 312 of third flip-flop 344 at time T8. The output 313 of fourth flip-flop 348 remains at a logic 1 value until after time T11.

The flip-flops 340 and 342 in the detection and synchronization circuit 301 are configured such that when a PWOK signal 307 glitches or transitions midway between two clock cycles, the changes are stored within the flip-flops and output on subsequent clock cycles. For example, the falling edge of PWOK signal 307 at T4 is output by the signal detection circuit 301 as a logic 0 value at time T6 and the rising edge of the PWOK signal 307 glitch occurring at T5 is then subsequently output by the detection and synchronization circuit 301 at time T7 as a logic 1 value. In other words the detection and synchronization circuit 201 may provide a synchronous record of the transitions in the PWOK signal 307 which may occur asynchronously during a clock cycle. The metastability circuit 315 may provide a means of ensuring that the glitch at T4 is passed onto the digital logic synchronously.

Figure 5:
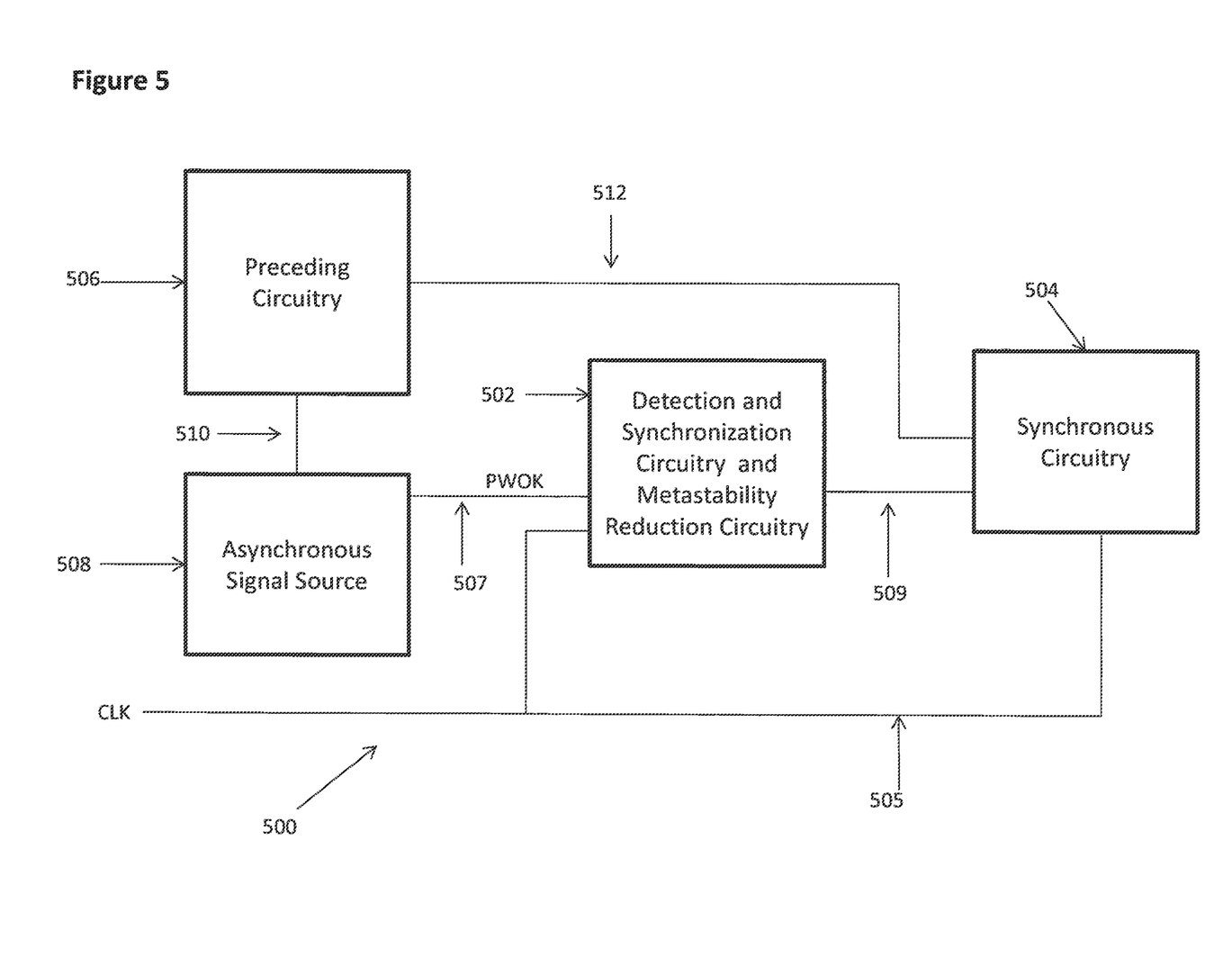
FIG. 5 shows a block diagram of a system comprising a detection and synchronization circuit.

FIG. 5 shows a block diagram of a system comprising the detection and synchronization circuit and metastability removal circuit.

The system 500 comprises preceding circuitry 506 configured to provide a first output signal 510 to voltage detection circuitry 508 and a second output signal 512 to synchronous circuitry 504.

The voltage detection circuitry 508 is configured to receive as an input the first output signal 510 provided by the preceding circuitry 506 and to provide as an output the PWOK signal

507 which is received as an input at the detection and synchronization circuitry and metastability reduction circuitry 502. The detection and synchronization circuitry and metastability reduction circuitry 502 is further configured to receive as an input a clock signal 505. The clock signal 505 is further received as an input by the synchronous circuitry 504. The detection and synchronization circuitry and metastability reduction circuitry 502 is configured to provide an output 509 which is received as an input at the synchronous circuitry 504. The synchronous circuitry 504 may be configured to receive as an input the signal 512 provided by the preceding circuitry 506 and the signal 509 provided by the detection and synchronization circuitry and metastability reduction circuitry 502.

The voltage detection circuitry 508 thus provides an asynchronous PWOK signal 507 to the detection and synchronization circuitry and metastability reduction circuitry 502 the detection and synchronization circuitry metastability reduction circuitry 502 then synchronizes the PWOK signal 507 as described above in relation to FIGS. 2A, 2B, 3 and 4 and provides an indication signal 509 to the synchronous circuitry 504.

As the synchronous circuitry 504 receives the same clock signal 505 as the detection and synchronization circuit and metastability reduction circuitry 502, the output 509 provided to the synchronous circuitry 504 is synchronized with the clock signal 509 of the synchronous circuitry 504.

Figure 6:
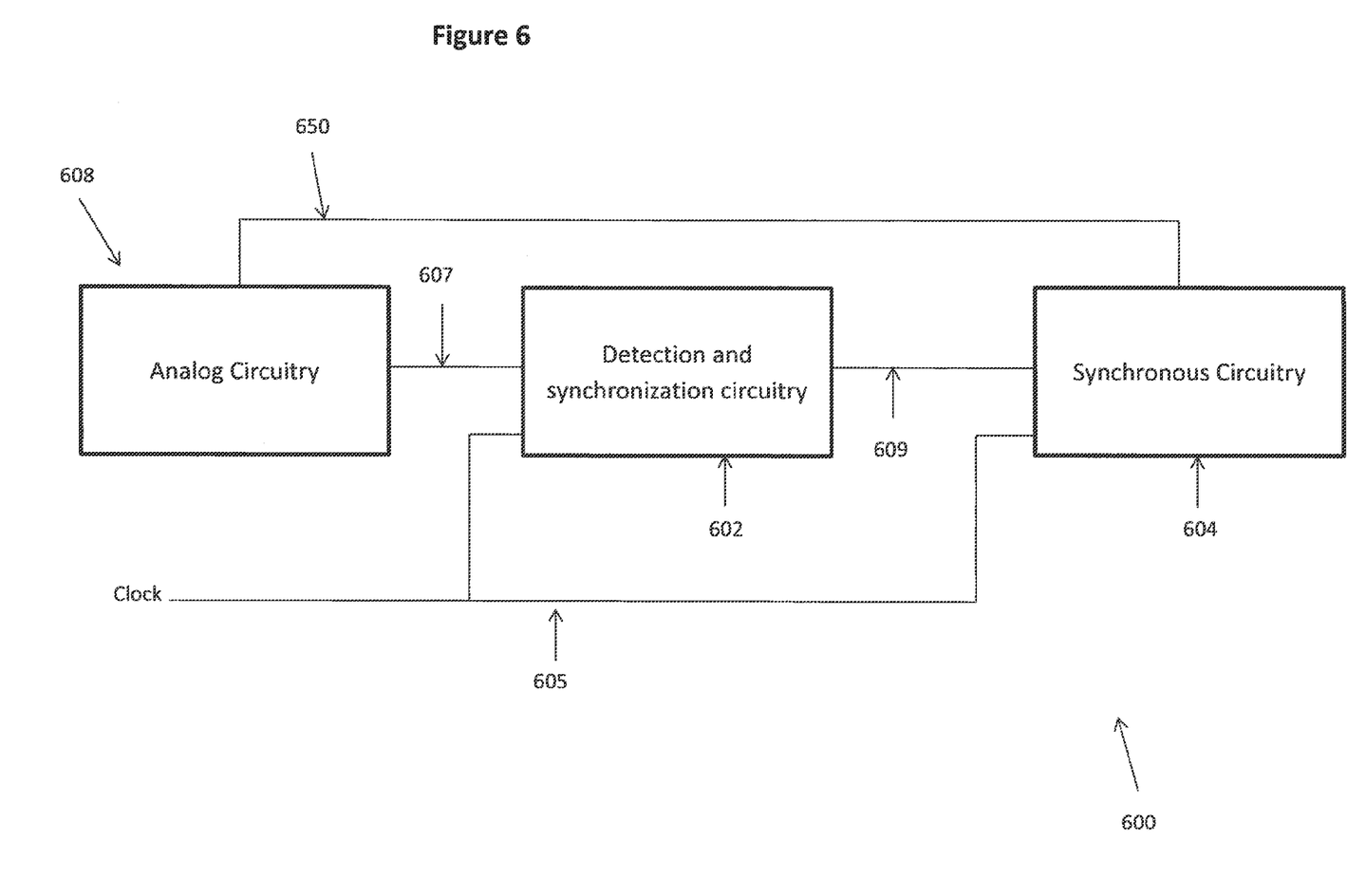
FIG. 6 shows a block diagram of an alternative system comprising a detection and synchronization circuit.

FIG. 6 shows analog circuitry 608 configured to provide as an output a PWOK signal 607 which is received as an input by detection and synchronization circuitry 602. The analog circuitry 608 is further configured to provide as an output a signal 650 which is received as an input by synchronous circuitry 604. The signal 650 may not be present in some embodiments in other embodiments the signal 650 may be bi-directional. In further embodiments the synchronous circuit 604 may be configured to provide signal 650 as an output which is received as an input by the analog circuitry 608. The detection and synchronization circuitry 602 and the synchronous circuitry 604 are both further configured to receive as an input a clock signal 605. The detection and synchronization circuitry 602 is further configured to provide as an output a signal 609 which is received as an input by the synchronous circuitry 604. The detection and synchronization circuitry 602 is configured to behave in the manner described above.

Some embodiments may further comprise the metastability reduction circuit described above.

In the embodiment shown in FIG. 6, when the PWOK signal 607 glitches, the detection and synchronization circuitry 602 indicates this occurred to the synchronous circuitry 604. This results in the synchronous circuitry 604 being aware of the error which may have occurred in the analog circuitry 608 and enables the synchronous circuitry to address this by means of the bidirectional connection 650. In other embodiments the synchronous circuitry 604 may simply record that there has been an error.

In some embodiments the synchronous circuit may be running very slowly and so the metastability reduction circuit may not be required, because the capture of the PWOK signal after re-synchronization may only need one flip-flop. In such conditions, the metastability reduction circuit may not be needed. If the fan out of the PWOK signal in the synchronous circuit is to several flip-flops then the metastability circuit may still required, however it may only comprise one flip-flop.

In some embodiments a voltage supply to a non-volatile memory may need to be detected by a voltage detector. In such embodiments the preceding circuitry 506 may comprise non-volatile memory. The synchronous circuitry 504 may comprise a finite state machine (FSM) that controls the non-volatile memory. The FSM may need to know whether the voltage connections provided to the memory are correct as very short glitches to the memory's power may affect data integrity over signal 512. Some embodiments make the FSM aware of the glitches which the synchronous circuit would otherwise not know about.

In some embodiments, non-volatile memory within the preceding circuitry connected may receive two voltages. However, the link used by signal 512 may only require of those voltages to work correctly. Thus if one voltage drops but not the other, the synchronous circuit will carry on functioning, unaware that there is a problem with the other voltage. Therefore the voltage detection circuit may check both that voltages are provided as expected.

In some embodiments analog circuitry may generate 0 or more short pulses which may need to be detected by synchronization circuitry.

In some embodiments the circuitry may synchronize the transitions of the PWOK signal 307 with the clock signal 305. In some embodiments the circuitry may lengthen the glitch period such that the rising and falling edges of the glitch may be received by the synchronous circuitry. In some embodiments the circuit may lengthen the glitch period such that the period between the rising and falling edges of the glitch when it is received by the synchronous circuitry lasts for one or more clock periods. This may improve the stability of the signal received by the synchronous circuitry.

In some embodiments the metastability reduction circuit 215 may be useful for high-frequency designs where the settling period of the PWOK signal may be longer. As may be seen in FIG. 2B, the metastability circuit 215 does not receive the PWOK signal and so may stabilize the signal output from the detection and synchronization circuit 201 before it is provided to the synchronous circuitry.

Some embodiments may stretch the low-pulse width of a glitch in the PWOK signal such that its width is at least one synchronous circuitry clock cycle width.

In some embodiments the detection and synchronization circuit 301 may comprise only one flip-flop. In other embodiments the detection and synchronization circuitry 301 may comprise more than two flip-flops. In some embodiments the number of flip-flops used may be dependent on a desired delay in the output signal.

In some embodiments the metastability reduction circuit may not be required. In some embodiments the metastability reduction circuit may comprise one or more flip-flops.

In some embodiments the PWOK signal may normally be at a logic 0 value and may glitch to a logic 1 value. In such embodiments the PWOK signal may be provided to a set input rather than a reset input of the flip-flops 340 and 342 and a logic 0 value may be input to the flip-flops rather than a logic 1 value.

In some embodiments the minimum duration of the pulse width to be detected may be the minimum pulse width of the reset input to the flip-flops in the synchronization circuit, which is silicon process dependent.

Some embodiments may be used to capture an asynchronous analog signal indicating whether a voltage is within a threshold.

Some embodiments may be used to capture a signal from a different circuit which may be synchronized to a different faster clock domain where it is not possible to receive the faster clock signal or where a handshake data transfer is not possible.

In some embodiments D type flip-flops may be used.

In some embodiments, the synchronous circuitry may comprise digital circuitry.

Various modifications to the embodiments described above will readily occur to the skilled person. The invention is not limited to theses specific examples.

What is claimed is:

1. An apparatus, comprising:
   a first circuit configured to provide a parameter signal;
   a first flip-flop configured to:
      receive said parameter signal from said first circuit at one of a set or a reset input, a clock signal at a clock input and a constant digital value at a data input; and
      output a synchronous signal wherein:
         when said parameter signal is in a first state, then said output synchronous signal is said digital value;
         when said parameter signal transitions to a second state, then said output synchronous signal transitions to an inverse of said digital value at substantially the same time; and
         when said parameter signal transitions back to said first state, then said output synchronous signal transitions to said digital value on a next clock edge;
   a test circuit configured to selectively pass the parameter signal to said one of the set or reset input of the first flip-flop when the apparatus is not in a test state and otherwise pass a reset signal to said one of the first set or reset input of the first flip-flop;
   at least one additional flop-flop is configured to:
      receive said output synchronous signal at a data input, a clock signal at a clock input and said reset signal at a reset input; and
      output said received output synchronous signal on a further clock edge to a second circuit.

2. The apparatus of claim 1, wherein said test circuit is configured to receive said parameter signal at a first input, said reset signal at a second input and a test signal at a third input, wherein when said test signal indicates said test state, said test circuit is configured to output said reset signal to the set or reset input of said first flip-flop and when said test signal does not indicate said test state, said test circuit is configured to output said parameter signal to the set or reset input of said first flip-flop.

3. The apparatus of claim 1, further comprising:
   at least one second flip-flop between said first flip-flop and said output to said at least one additional flip flop, said at least one second flip-flop configured to:
      receive said parameter signal from said first circuit at one of a set or a reset input, a clock signal at a clock input and said synchronous signal from a preceding flip-flop at a data input; and
      output said synchronous signal:
         wherein when said parameter signal transitions to said second state, then said output synchronous signal transitions to an inverse of said digital value at substantially the same time; and
         wherein when said parameter signal transitions back to said first state, then said at least one further flip-flop outputs said synchronous signal on a next clock edge;
   said test circuit further configured to selectively pass the parameter signal to said one of the set or reset input of the second flip-flop when the apparatus is not in said test state and otherwise pass said reset signal to said one of the first set or reset input of the second flip-flop.

4. The apparatus of claim 3, wherein the test circuit is configured to receive said parameter signal at a first input, said reset signal at a second input and a test signal at a third input, wherein when said test signal indicates said test state, said test circuit is configured to output said reset signal to the set or reset input of said first flip-flop and at least one second flip-flop and when said test signal does not indicate said test state, said test circuit is configured to output said parameter signal to the set or reset input of said first flip-flop and at least one second flip-flop.

5. The apparatus of claim 1, wherein said synchronous signal output to the second circuit corresponds to a detection of a change in said parameter signal, said change in said parameter signal lasting less than a clock cycle.

6. The apparatus of claim 4, wherein said test circuit is a multiplexer.

7. The apparatus of claim 1, wherein said parameter signal comprises information about at least one voltage, current or power provided to said first circuit.

8. The apparatus of claim 1, wherein said parameter signal is asynchronous with respect to said clock signal.

9. The apparatus of claim 1, wherein a period of said clock signal is slower than the period of at least one transition of said parameter signal.

10. The apparatus of claim 1, wherein said synchronous signal is synchronous with respect to said clock signal.

11. The apparatus of claim 1, wherein said first circuit comprises a memory.

12. The apparatus of claim 1, wherein said apparatus is a monitoring circuit.

13. The apparatus of claim 11, wherein said second circuit is configured to read from or write to said memory.

14. The apparatus of claim 1, further comprising: a second synchronous circuit configured to be synchronized by a second clock and to receive said synchronous signal.

15. The apparatus of claim 1, implemented as an integrated circuit device.

16. A method, comprising:
   receiving a parameter signal at one of a set or a reset input of a first flip-flop, a clock signal at a clock input of said first flip-flop and a constant digital value at a data input of said first flip-flop;
   outputting a synchronous signal wherein:
      when said parameter signal is in a first state, then said output synchronous signal is said digital value;
      wherein when said parameter signal transitions to a second state, then said output synchronous signal transitions to an inverse of said digital value at substantially the same time; and
      wherein when said parameter signal transitions back to said first state, then said output synchronous signal transitions to said digital value on a next clock edge;
      wherein said output synchronous signal corresponds to a detection of a change in said parameter signal;
   selectively passing the parameter signal to said one of the set or reset input of the first flip-flop when not in a test state and otherwise passing a reset signal to said one of the first set or reset input of the first flip-flop;
   receiving at a data input of at least one additional flip-flop said output synchronous signal, a clock signal at a clock input and said reset signal at a reset input; and
   outputting said received output synchronous signal on a further clock edge.

17. The method of claim 16, wherein selectively passing comprises:
   receiving said parameter signal at a first input of a test circuit, said reset signal at a second input of said test circuit and a test signal at a third input of said test circuit;

outputting said reset signal from said test circuit to the set or reset input of said first flip-flop when said test signal indicates said test state; and outputting said parameter signal from said test circuit to the set or reset input of said first flip-flop when said test signal does not indicate said test state.

18. The method of claim 17, further comprising:

receiving said parameter signal at one of a set or a reset input of a second flip flop, a clock signal at a clock input and said synchronous signal from a preceding flip-flop at a data input;

selectively passing the parameter signal to said one of the set or reset input of the second flip-flop when not in said test state and otherwise passing said reset signal to said one of the first set or reset input of the second flip-flop; and outputting said synchronous signal from said second flip flop wherein when said parameter signal transitions to said second state, then said output synchronous signal transitions to an inverse of said digital value at substantially the same time and when said parameter signal transitions back to said first state, then said synchronous signal is output on a next clock edge.

19. The method of claim 18, wherein selectively passing comprises:

receiving said parameter signal at a first input of a test circuit, said reset signal at a second input of said test circuit and a test signal at a third input of said test circuit, outputting said reset signal to the set or reset input of the first flip-flop and the second flip-flop when said test signal indicates said test state; and outputting said parameter signal to the set or reset input of said first flip-flop and second flip-flop when said test signal does not indicate said test state.

* * * * *